(12) United States Patent
Kim et al.

(10) Patent No.: US 12,113,107 B2
(45) Date of Patent: Oct. 8, 2024

(54) METHOD FOR FABRICATING SEMICONDUCTOR DEVICE

(71) Applicant: SK hynix Inc., Gyeonggi-do (KR)

(72) Inventors: Dae Won Kim, Gyeonggi-do (KR); Tae Kyun Kim, Gyeonggi-do (KR); Dong Goo Choi, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 451 days.

(21) Appl. No.: 17/549,328

(22) Filed: Dec. 13, 2021

(65) Prior Publication Data
US 2022/0352323 A1   Nov. 3, 2022

(30) Foreign Application Priority Data

Apr. 28, 2021  (KR) .................. 10-2021-0055217

(51) Int. Cl.
| | |
|---|---|
| *H01L 29/40* | (2006.01) |
| *H01L 21/311* | (2006.01) |
| *H01L 21/3213* | (2006.01) |
| *H01L 21/768* | (2006.01) |
| *H10B 12/00* | (2023.01) |

(52) U.S. Cl.
CPC ...... *H01L 29/401* (2013.01); *H01L 21/31144* (2013.01); *H01L 21/32139* (2013.01); *H01L 21/76834* (2013.01); *H10B 12/09* (2023.02); *H10B 12/482* (2023.02); *H10B 12/485* (2023.02)

(58) Field of Classification Search
CPC ............. H01L 29/401; H01L 21/32139; H01L 21/76834; H01L 21/3063; H01L 21/308; H10L 21/31144; H10L 21/3065; H10B 12/19; H10B 12/482; H10B 12/485; H10B 12/02; H10B 12/053; H10B 41/42; H10B 41/50; H10B 43/50; H10B 51/50; H10B 53/50
See application file for complete search history.

(56) References Cited

U.S. PATENT DOCUMENTS

| | | | |
|---|---|---|---|
| 10,109,529 B2 | 10/2018 | Koh et al. | |
| 2011/0024811 A1* | 2/2011 | Kim | ............ H01L 29/66621 |
| | | | 257/E21.616 |
| 2013/0137258 A1* | 5/2013 | Shin | .................. H10B 12/34 |
| | | | 438/589 |
| 2013/0196477 A1* | 8/2013 | Kang | .................. H10B 12/09 |
| | | | 438/270 |

(Continued)

*Primary Examiner* — Galina G Yushina
(74) *Attorney, Agent, or Firm* — IP & T GROUP LLP

(57) ABSTRACT

A method for fabricating a semiconductor device includes: forming an insulating layer over a substrate including a cell region and a peripheral region; forming an opening in the insulating layer by selectively etching the insulating layer in the cell region; forming a plug conductive layer to fill the opening and cover the insulating film; etching the plug conductive layer and the insulating layer in the peripheral region by using a peri-open mask covering the cell region; trimming the peri-open mask to expose the plug conductive layer in a boundary region where the cell region and the peripheral region contact each other; etching the plug conductive layer in the boundary region by using the trimmed peri-open mask; forming a peri-gate conductive layer over the entire surface of the substrate; and etching the peri-gate conductive layer by using a cell open mask.

17 Claims, 19 Drawing Sheets

(56) References Cited

U.S. PATENT DOCUMENTS

| | | | |
|---|---|---|---|
| 2013/0248997 A1* | 9/2013 | Jang | H01L 21/823456 257/334 |
| 2016/0118331 A1* | 4/2016 | Kim | H10B 12/09 257/401 |
| 2019/0221669 A1* | 7/2019 | Lee | H10B 12/30 |

* cited by examiner

METHOD FOR FABRICATING SEMICONDUCTOR DEVICE

CROSS-REFERENCE TO RELATED APPLICATIONS

The present application claims priority to Korean Patent Application No. 10-2021-0055217, filed on Apr. 28, 2021, which is herein incorporated by reference in its entirety.

BACKGROUND

1. Field

The present invention relates to a method for fabricating a semiconductor device, and, more particularly, to a method for fabricating a semiconductor device including a bitline.

2. Description of the Related Art

As semiconductor devices are more densely integrated, design rules for components of semiconductor devices have been reduced. Also, processes of forming a bitline in a cell array region and forming a gate pattern in a peripheral circuit region may be performed at the same time in a fabrication method of a highly integrated semiconductor device.

SUMMARY

Various embodiments of the present invention provide a method for fabricating a semiconductor device which can resolve a polysilicon residue issue at a boundary region between a cell region and a peripheral region.

According to one embodiment of the present invention, a method for fabricating a semiconductor device comprises: forming an insulating layer over a substrate, the substrate including a cell region and a peripheral region; forming an opening in the insulating layer by selectively etching the insulating layer in the cell region; forming a plug conductive layer to fill the opening and cover the insulating film; etching the plug conductive layer and the insulating layer in the peripheral region by using a peri-open mask covering the cell region; trimming the peri-open mask to expose the plug conductive layer in a boundary region where the cell region and the peripheral region contact each other; etching the plug conductive layer in the boundary region by using the trimmed peri-open mask; forming a peri-gate conductive layer over the entire surface of the substrate; and etching the peri-gate conductive layer by using a cell open mask.

In one embodiment, the present invention can improve the reliability of a semiconductor device by addressing a polysilicon residue issue occurring at a boundary region between a cell region and a peripheral region.

DETAILED DESCRIPTION

Figure 1:
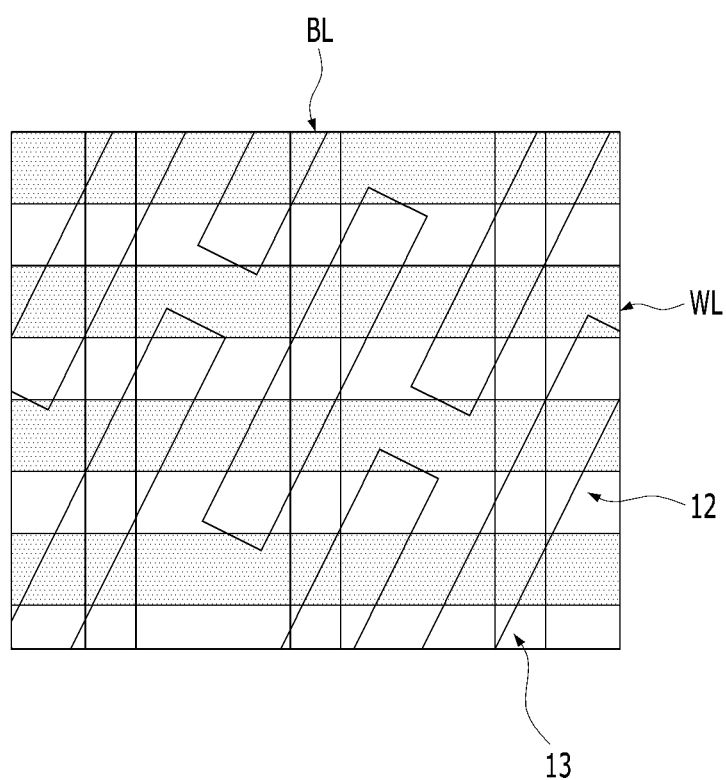
FIG. 1 is a plan view illustrating a semiconductor device according to one embodiment of the present invention.

Various embodiments will be described with reference to cross-sectional views, plan views and block diagrams, which are schematic views of the present invention. Therefore, the structures of the drawings may be modified by fabricating technology and/or tolerances. The embodiments of the present invention are not limited to the specific structures shown in the drawings, but include changes in the structures that may be produced according to the fabricating process. Also, any regions and shapes of regions illustrated in the drawings having schematic views are intended to illustrate specific examples of structures of regions of the various elements, and are not intended to limit the scope of the invention.

Figure 2A:
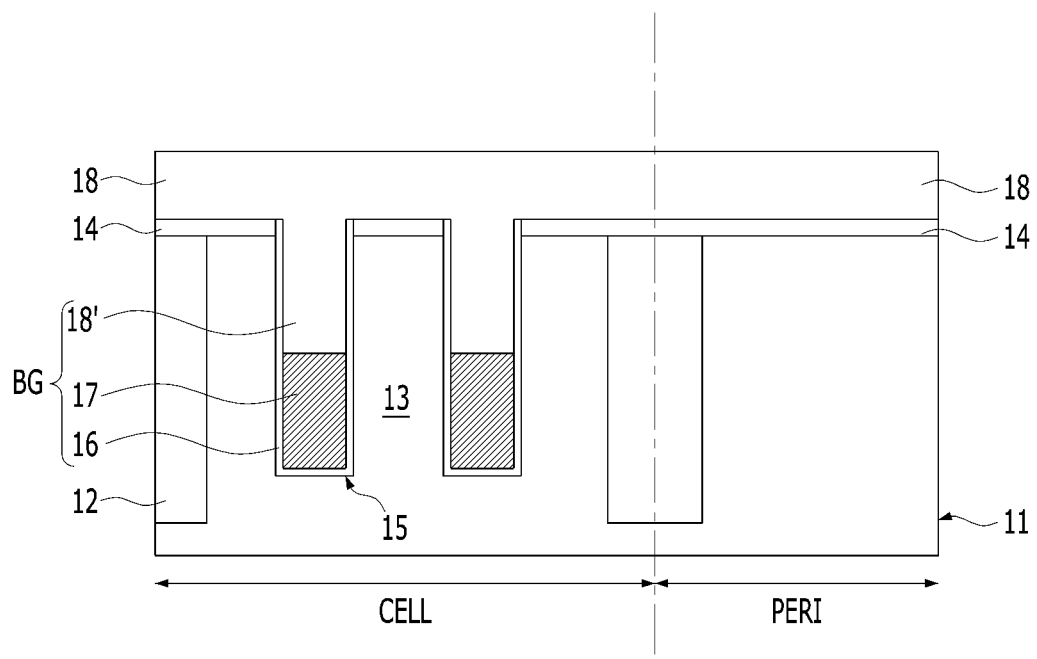
FIGS. 2A to 2P are cross-sectional views illustrating a method for fabricating a semiconductor device according to one embodiment of the present invention.

FIG. 1 is a plan view illustrating a semiconductor device according to one embodiment of the present invention. FIGS. 2A to 2P are cross-sectional views illustrating a method for fabricating a semiconductor device according to one embodiment of the present invention. FIGS. 3A and 3B are cross-sectional views illustrating a method for fabricating a semiconductor device according to another embodiment of the present invention.

As shown in FIG. 1, the semiconductor device includes an active region 13 defined by an isolation layer 12 in a semiconductor substrate. A word line WL crossing the active region 13 is formed in the semiconductor substrate.

A bitline structure BL is formed in a vertical direction to the word line WL.

As shown in FIG. 2A, a substrate 11 including a cell region CELL and a peripheral region PERI may be provided. The cell region CELL may include a word line, a bitline, a capacitor, and so forth. The cell region CELL may be a memory cell region for storing data and may be driven by selecting a word line and a bitline. The peripheral region PERI may include a core region and a peripheral circuit region. The peripheral region PERI is formed around the cell region CELL and is configured as a circuit region for driving and controlling the memory cell.

The substrate 11 may include the active region 13 defined by the isolation layers 12. The active regions 13 may be spaced apart at a constant interval by the isolation layer 12. The cell region CELL and the peripheral region PERI may be spaced apart by the isolation layer 12.

The substrate 11 may be a material suitable for semiconductor processing. The substrate 11 may include a semiconductor substrate. The substrate 11 may be made of a material containing silicon. The substrate 11 may include, for example, silicon, monocrystalline silicon, polysilicon, amorphous silicon, silicon germanium, monocrystalline silicon germanium, polycrystalline silicon germanium, carbon-doped silicon, combinations thereof, or multiple layers thereof. The substrate 11 may also include other semiconductor materials such as germanium. The substrate 11 may include a III/V group semiconductor substrate, for example, a compound semiconductor substrate such as GaAs. The substrate 11 may be a silicon on insulator (SOI) substrate.

The isolation layer 12 may be formed by a shallow trench isolation (STI) process. The STI process is as follows. The substrate 11 is etched to form a separation trench. The separation trench is filled with an insulating material, thereby forming the isolation layer 12. The isolation layer 12 may include, for example, silicon oxide, silicon nitride, or a combination thereof. Chemical vapor deposition (CVD) or other deposition processes may be used to fill the separation trench with an insulating material. A planarization process such as chemical mechanical polishing (CMP) may additionally be used.

Next, a buried gate structure BG may be formed in the substrate 11 of the cell region CELL. The buried gate structure BG may include a gate trench 15, a gate insulating layer 16 covering the bottom and sidewalls of the gate trench 15, a buried gate electrode 17 partially filling the gate trench 15 on the gate insulating layer 16, and a gate capping layer 18' formed on the buried gate electrode 17.

The method of forming the buried gate structure BG is as follows.

First, the gate trench 15 may be formed in the substrate 11 of the cell region CELL. The gate trench 15 may have a line shape crossing the active regions 13 and the isolation layer 12. The gate trench 15 may be formed by forming a mask pattern on the substrate 11 and performing an etching process using the mask pattern as an etching mask. A hardmask layer 14 may be used as an etching barrier for forming the gate trench 15. The hardmask layer 14 may have a shape patterned by the mask pattern. The hardmask layer 14 may cover an entire surface of the substrate in the peripheral region PERI. The hardmask layer 14 may include silicon oxide. The hardmask layer 14 may be TEOS (Tetra Ethyl Ortho Silicate). The bottom surface of the gate trench 15 may be at a higher level than the bottom surface of the isolation layer 12.

Although not shown, a part of the isolation layer 12 of the cell region CELL may be recessed to protrude the active region 13 under the gate trench 15. Accordingly, a fin region (a reference numeral is omitted) under the gate trench 15 may be formed. The fin region may be a part of a channel region.

Next, a gate insulating layer 16 may be formed on the bottom surface and sidewalls of the gate trench 15. Before the gate insulating layer 16 is formed, etching damage on the surface of the gate trench 15 may be cured. For example, after forming the sacrificial oxide by thermal oxidation treatment, the sacrificial oxide may be removed.

The gate insulating layer 16 may be formed by a thermal oxidation process. For example, the gate insulating layer 16 may be formed by oxidizing the bottom and sidewalls of the gate trench 15.

In another embodiment, the gate insulating layer 16 may be formed by a depositing method such as a chemical vapor deposition (CVD) or atomic layer deposition (ALD). The gate insulating layer 16 may include, for example, a high-k material, oxide, nitride, oxynitride, or a combination thereof. The high-k material may include hafnium oxide. The hafnium-containing material may include, for example, hafnium oxide, hafnium silicon oxide, hafnium silicon oxynitride, or a combination thereof. In another embodiment, the high-k material may include, for example, lanthanum oxide, lanthanum aluminum oxide, zirconium oxide, zirconium silicon oxide, zirconium silicon oxynitride, aluminum oxide, and a combination thereof.

In another embodiment, the gate insulating layer 16 may be formed by depositing a liner polysilicon and then radically oxidizing the liner polysilicon layer.

In another embodiment, the gate insulating layer 16 may be formed by forming a liner silicon nitride layer and then radically oxidizing the liner silicon nitride layer.

Next, a buried gate electrode 17 may be formed on the gate insulating layer 16. To form the buried gate electrode 17, a recessing process may be performed after forming a conductive layer to fill the gate trench 15. The recessing process may be performed by an etchback process, or by a sequence of a chemical mechanical polishing (CMP) process and an etchback process in this order. The buried gate electrode 17 may have a recessed shape that partially fills the gate trench 15. That is, an upper surface of the buried gate electrode 17 may be at a lower level than an upper surface of the active region 13. The buried gate electrode 17 may include a metal, a metal nitride, or a combination thereof.

For example, the buried gate electrode 17 may be formed of titanium nitride (TiN), tungsten (W) or a titanium nitride/tungsten (TiN/W) stack. The titanium nitride/tungsten (TiN/W) stack may have a structure in which titanium nitride is conformally formed and then the gate trench 15 is partially filled with tungsten. The buried gate electrode 17 may be made of titanium nitride alone, and this may be referred to as a buried gate electrode 17 of a "TiN Only" structure. The buried gate electrode 17 may have a double gate structure in which a titanium nitride/tungsten (TiN/W) stack and a polysilicon layer are used.

Next, capping layers 18 and 18' may be formed over the entire surface of the substrate 11 including the buried gate electrode 17. The capping layers 18 and 18' may include an insulating material. Thus, the capping layers 18 and 18' may be referred to as insulating layers. The capping layers 18 and 18' may include silicon nitride. In another embodiment, the capping layers 18 and 18' may include silicon oxide. In yet another embodiment, the capping layers 18 and 18' may have a NON (Nitride-Oxide-Nitride) structure.

The capping layers 18 and 18' may be divided into a gate capping layer 18' that gap-fills the gate trench 15 on the buried gate electrode 17 and a protective capping layer 18 covering the upper surface of the hardmask layer 14. The buried gate structure BG may be formed by the gate insulating layer 16, the buried gate electrode 17, and the gate capping layer 18'. The buried gate structure BG may be referred to as a 'word line WL'.

In one embodiment, the upper surface of the protective capping layer 18 may be at a higher level than the upper surface of the hardmask layer 14. In this embodiment, the protective capping layer 18 may cover both the hardmask layer 14 and the buried gate structure BG.

Next, an impurity region (not shown) may be formed in the substrate 11 on both sides of the buried gate structure BG. The impurity region may be formed by a doping process such as implantation. The impurity region may be referred to as a source/drain region. The impurity region between neighboring buried gate structures BG may be a region to which a bitline contact plug is to be connected. The impurity region outside the buried gate structure BG may be a region to which a storage node contact plug is to be connected.

Figure 2B:
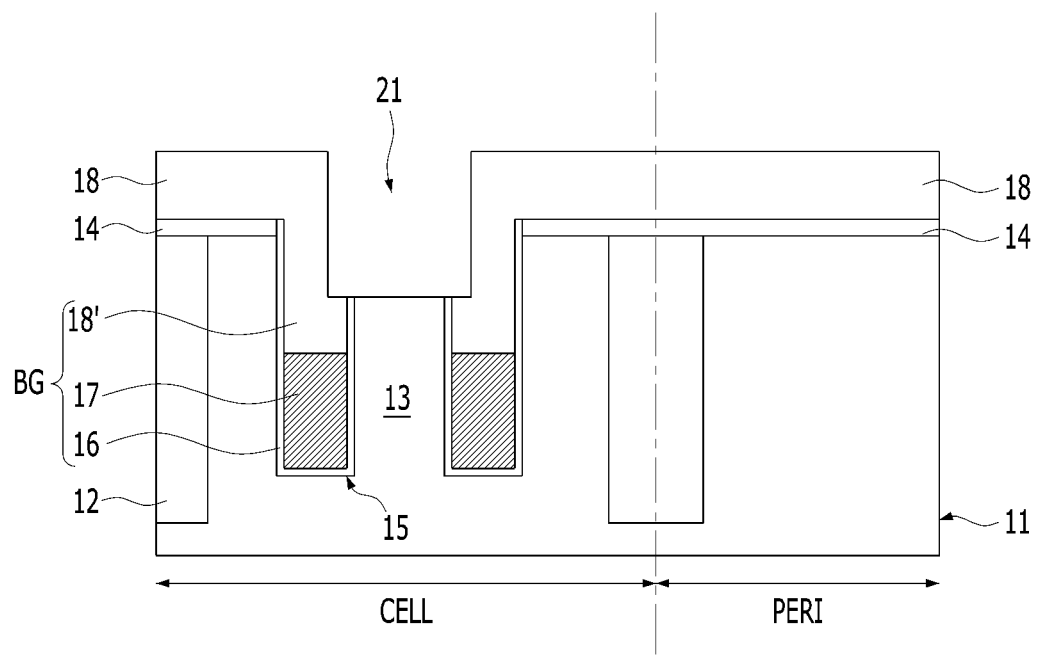

As shown in FIG. 2B, a bitline contact hole 21 may be formed. The bitline contact hole 21 may be disposed between neighboring buried gate structures BG. The protective capping layer 18 and the hardmask layer 14 may be etched by using a contact mask (not shown) to form the bitline contact hole 21. A part of the substrate 11 may be exposed by the bitline contact hole 21. The bitline contact hole 21 may have a diameter controlled by a predetermined line width. The bitline contact hole 21 may have a shape exposing a part of the active region 13. The bitline contact hole 21 has a diameter larger than the width of the minor axis of the active region 13. Accordingly, in an etching process for forming the bitline contact hole 21, the isolation layer 12 and a part of the active region 13 may be etched. That is, the isolation layer 12 and the active region 13 under the bitline contact hole 21 may be recessed by a predetermined depth. Accordingly, the bottom of the bitline contact hole 21 may be expanded into the substrate 11.

Figure 2C:
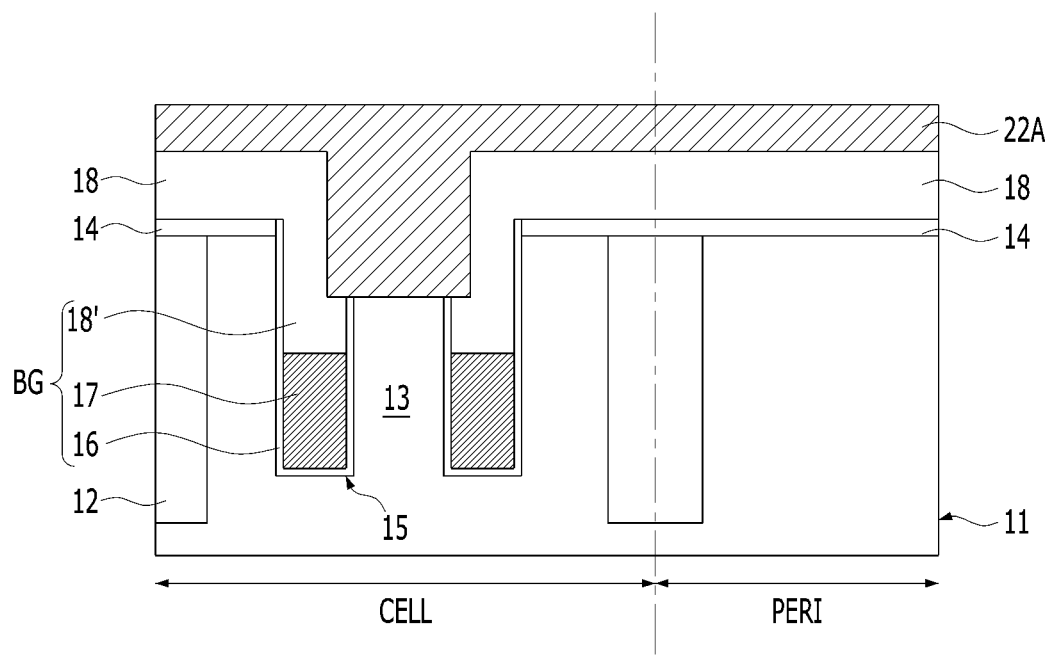

As shown in FIG. 2C, a plug conductive layer 22A may be formed on the bitline contact hole 21 and the protective capping layer 18. The plug conductive layer 22A may be applied to the bitline contact and a part of the bitline structure. The plug conductive layer 22A may include a material having an etch selectivity with respect to the protective capping layer 18. The plug conductive layer 22A may include polysilicon. The plug conductive layer 22A may include polysilicon doped with impurities.

Figure 2D:
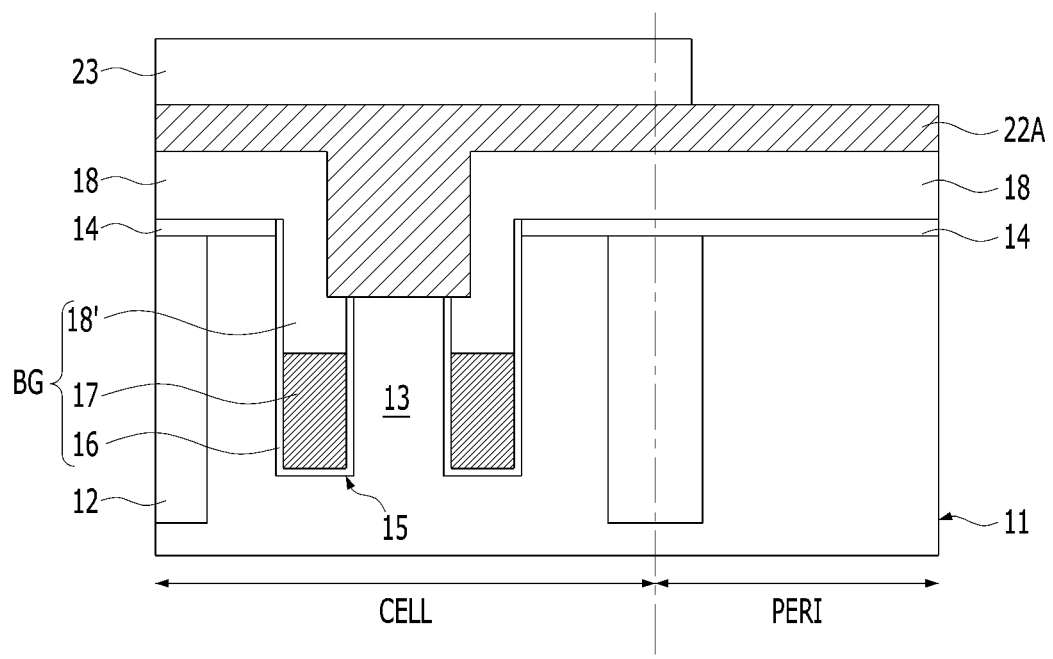
Figure 2E:
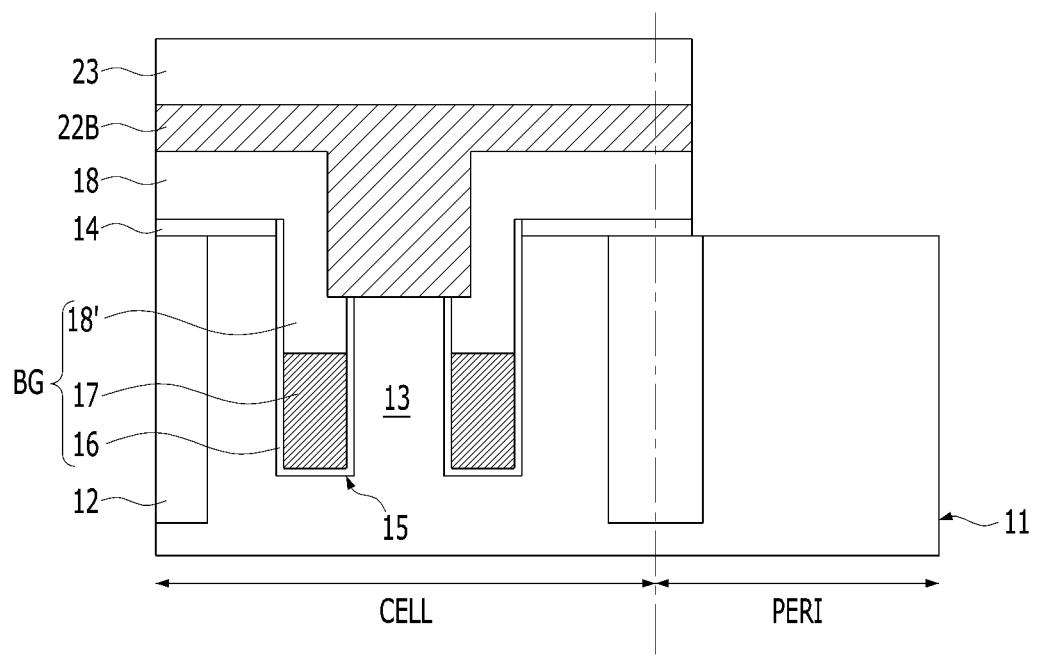

As shown in FIGS. 2D and 2E, a peri-open mask 23 may be formed on the plug conductive layer 22A of the cell region CELL. The peri-open mask 23 is a mask for opening the peripheral region, and may cover a boundary region where the cell region CELL and the peripheral area PERI contact each other. The peri-open mask 23 may include a photoresist.

Subsequently, the plug conductive layer 22A, the protective capping layer 18, and the hardmask layer 14 exposed by the peri-open mask 23 may be sequentially etched. Accordingly, an etched plug conductive layer 22B, the protective capping layer 18, and the hardmask layer 14 may remain over the upper surface of the substrate where the cell region CELL and the boundary region where the cell region CELL and the peripheral region PERI contact each other. The substrate 11 may be exposed in the peripheral region PERI.

Figure 2F:
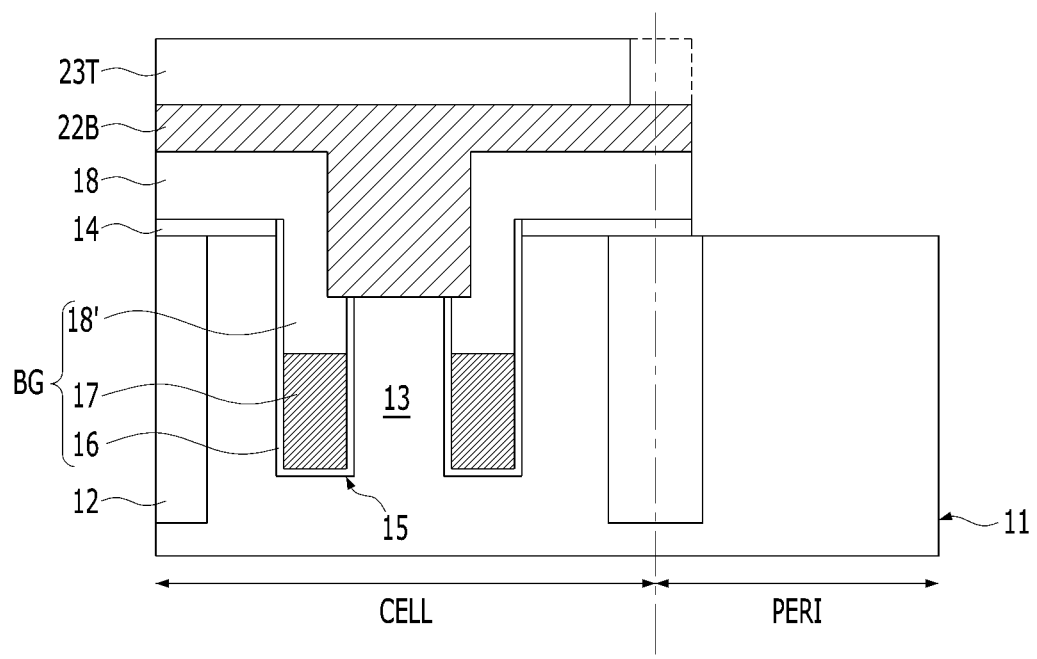
Figure 2G:
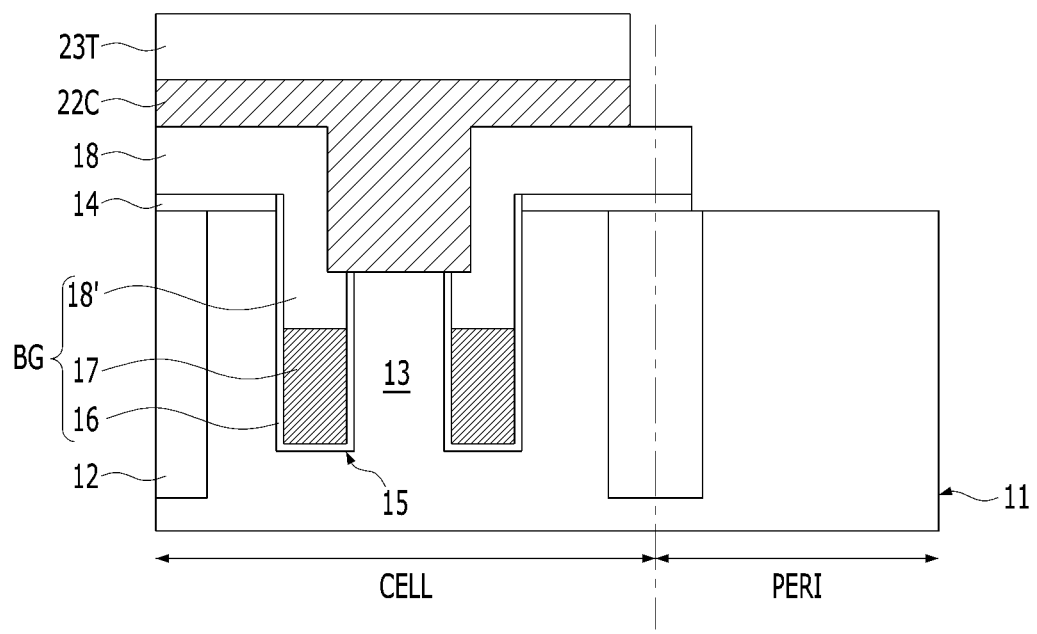
Figure 2H:
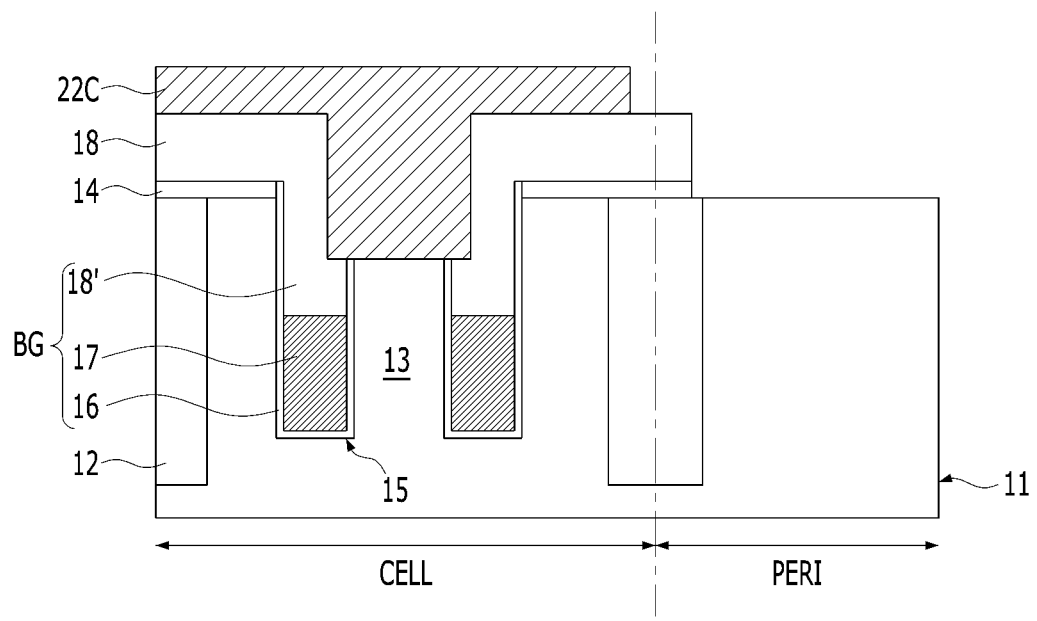

As shown in FIGS. 2F to 2H, the peri-open mask 23 may be trimmed. The trimmed peri-open mask 23T may expose the plug conductive layer 22B in the boundary region where the cell region CELL and the peripheral region PERI contact each other. That is, the trimmed peri-open mask 23T may entirely cover the plug conductive layer 22B in the cell region CELL, and selectively expose the plug conductive layer 22B at the boundary region where the cell region CELL and the peripheral region PERI contact each other.

Subsequently, the plug conductive layer 22B may be etched in the cell region CELL where the plug conductive layer 22B is exposed by the trimmed peri-open mask 23T and in the boundary region where the peripheral region PERI contacts to. Accordingly, a plug conductive layer 22C may remain only in the cell region CELL. The etching process using the trimmed peri-open mask 23T may proceed to reveal an exposed portion of the protective capping layer 18. Accordingly, the protective capping layer 18 remains in the boundary region where the cell region CELL and the peripheral region PERI contact each other. The substrate 11 may be exposed in the peripheral region PERI.

Subsequently, the trimmed peri-open mask 23T may be removed. The trimmed peri-open mask 23T may be removed by a strip process.

Figure 2I:
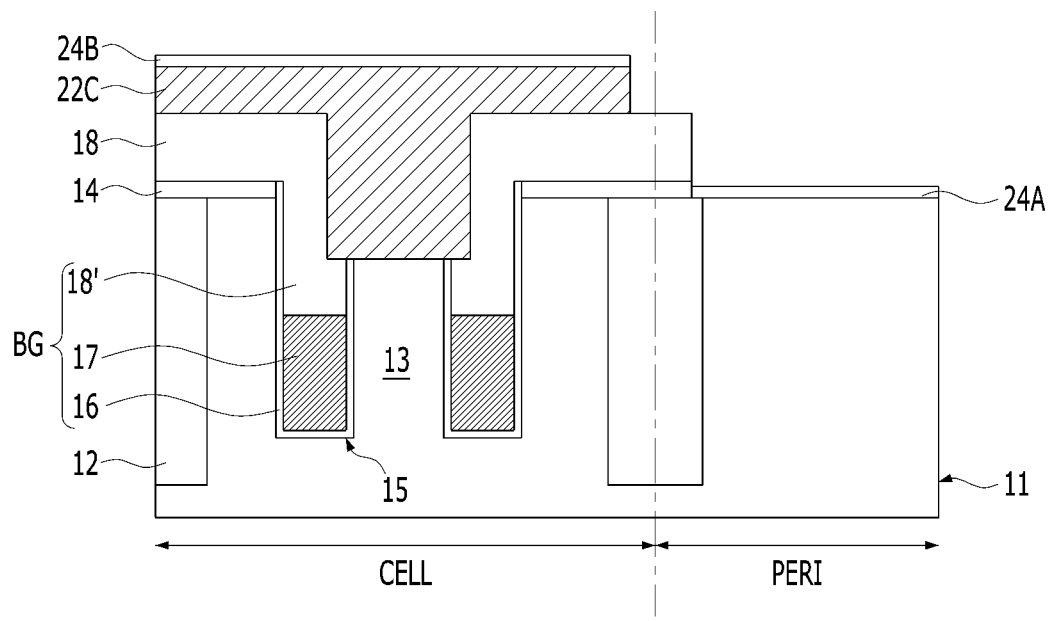
Figure 2J:
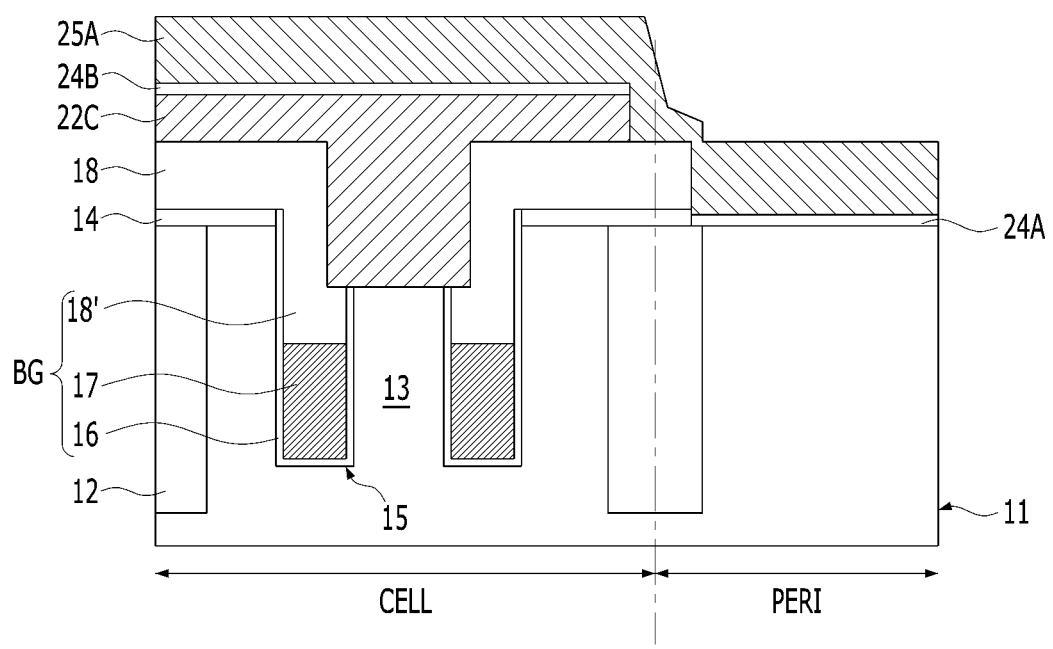
Figure 2K:
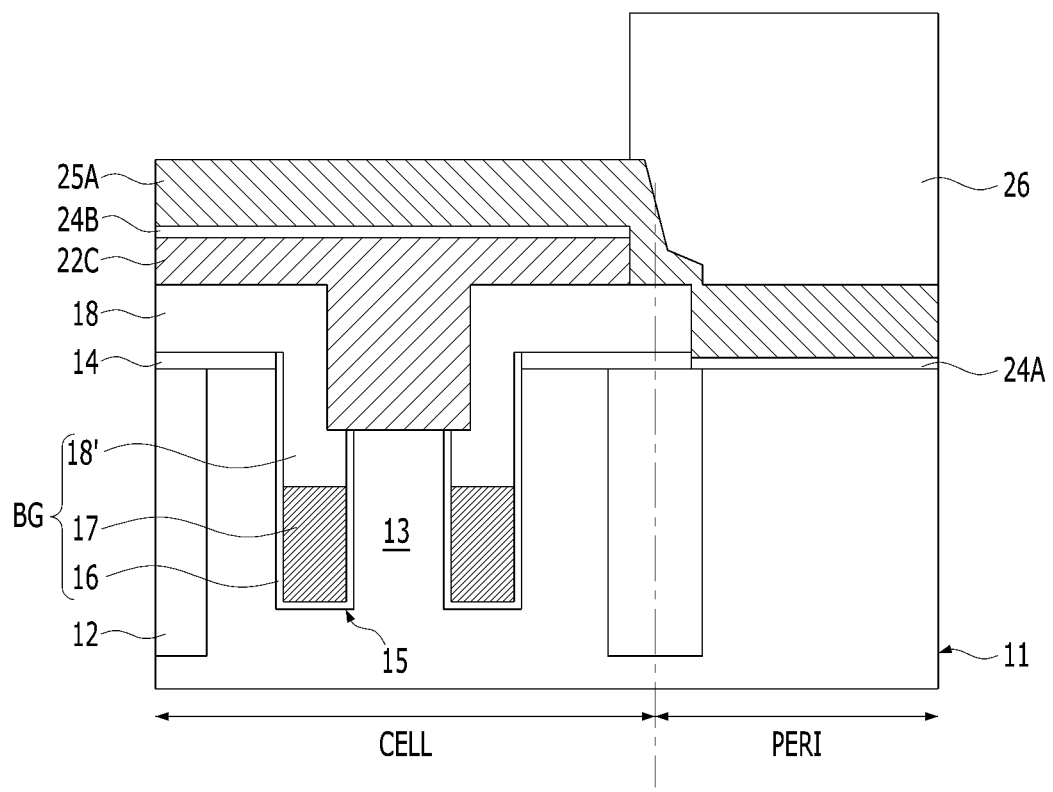
Figure 2L:
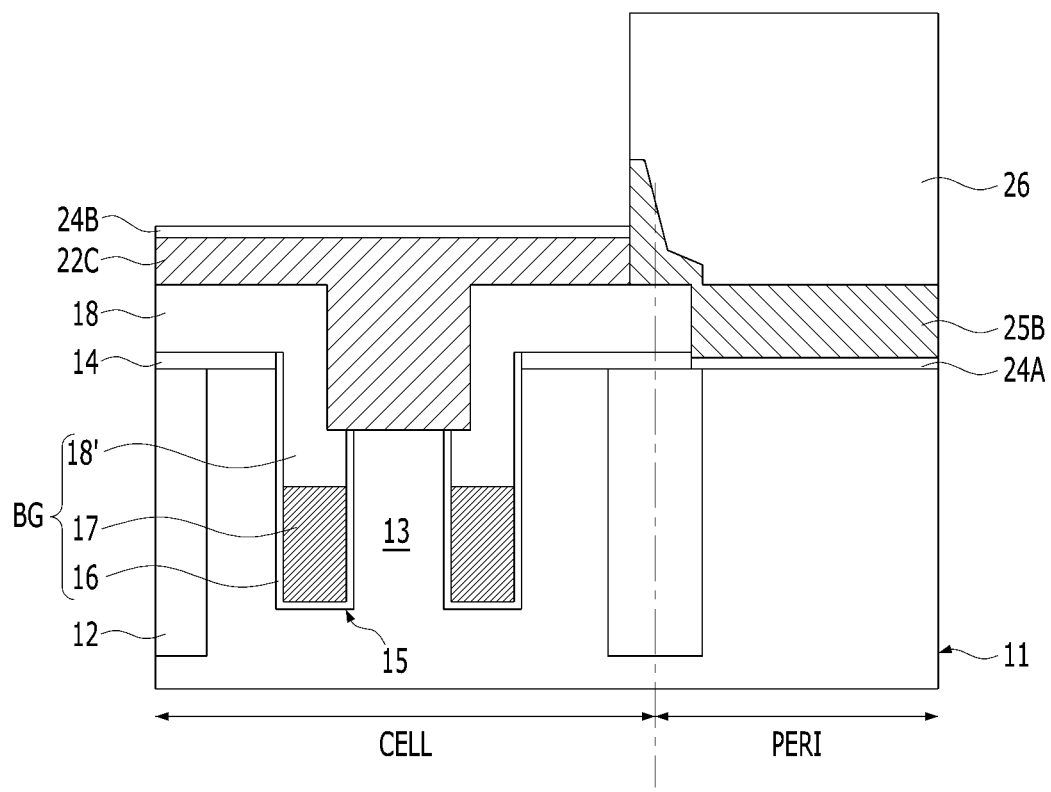

As shown in FIGS. 2I and 2J, barrier layers 24A and 24B and a peri-gate conductive layer 25A may be sequentially formed over the entire surface of the substrate 11 including the plug conductive layer 22C.

The barrier layers 24A and 24B may cover the plug conductive layer 22C and the entire surface of the substrate 11 in the peripheral region PERI. Although not shown, the barrier layers 24A and 24B may also be formed on the protective capping layer 18 in the boundary region where the cell region CELL and the peripheral region PERI contact each other. The barrier layers 24A and 24B may include a material having an etch selectivity with respect to the plug conductive layer 22C and the peri-gate conductive layer 25A. The barrier layers 24A and 24B may include an insulating material. The barrier layers 24A and 24B may include silicon oxide. The barrier layer 24B in the cell region may serve as a separation layer separating the plug conductive layer 22C from the peri-gate conductive layer 25A in the cell region. In a subsequent process, the barrier layer 24B in the cell region may serve as an etching barrier preventing damage to the plug conductive layer 22C when the peri-gate conductive layer 25A is etched. The barrier layer 24A of the peripheral region PERI may serve as a gate insulating layer.

As shown in FIGS. 2K to 2N, a cell open mask 26 may be formed on the peri-gate conductive layer 25A of the peripheral region PERI. The cell open mask 26 is a mask for opening a cell region, and may also cover a peripheral region PERI and the boundary region in which the cell region CELL and the peripheral region PERI contact each other. That is, the boundary region where the cell region CELL and the peripheral region PERI are in contact may be covered by both the peri-open mask 23 of FIG. 2E and the cell open mask 26. The cell open mask 26 may include a photoresist.

Subsequently, the peri-gate conductive layer 25A of the cell region CELL may be etched using the cell open mask 26. Accordingly, a peri-gate conductive layer 25B may be formed and may remain in the peripheral region PERI and the boundary region where the peripheral region PERI and the cell region CELL contact each other. In the etching process using the cell open mask 26, the plug conductive layer 22C may not be damaged because of the presence of the barrier layer 24B over the plug conductive layer 22C. For example, the etching process may have an etching selectivity with respect to the barrier layer 24B and may be performed under a condition in which only the peri-gate conductive layer 25A may be selectively etched.

In another embodiment, as shown in FIGS. 3A and 3B, an etching process may be performed after exposing the peri-gate conductive layer 25B in the boundary region where the cell region CELL and the peripheral region PERI contact each other by trimming the cell open mask 26.

Subsequently, the barrier layer 24B of the cell region CELL may be removed. The barrier layer 24B may be removed by a wet etching process, but is not limited thereto. The process of removing the barrier layer 24B may be performed under a condition in which damage to the plug conductive layer 22C is minimized. The process of removing the barrier layer 24B may be performed under a condition having an etch selectivity with respect to the plug conductive layer 22C.

Figure 2M:
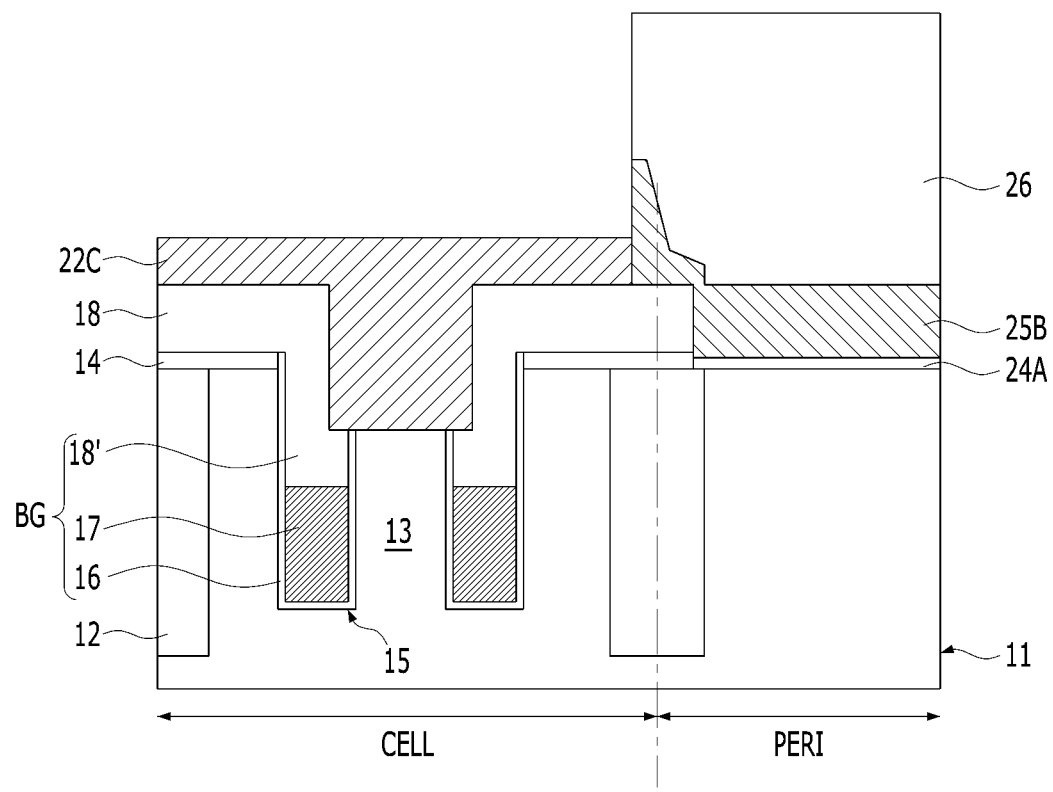

Accordingly, the plug conductive layer 22C may remain over the substrate 11 of the cell region CELL, and the peri-gate conductive layer 25B may remain on the substrate 11 of the peripheral region PERI (as shown in FIG. 2M). Because the boundary region where the cell region CELL and the peripheral region PERI are in contact is covered by the cell open mask 26, the peri-gate conductive layer 25B may remain on the protective capping layer 18.

Figure 2N:
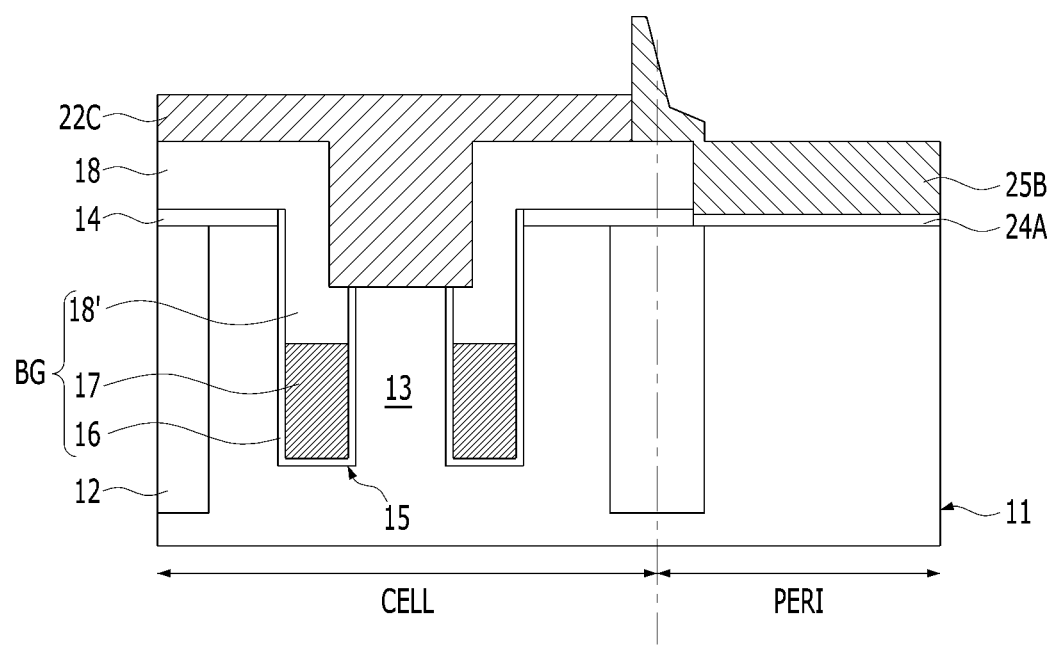

Subsequently, the cell open mask 26 may be removed (as shown in FIG. 2N). The cell open mask 26 may be removed by a strip process.

Figure 2O:
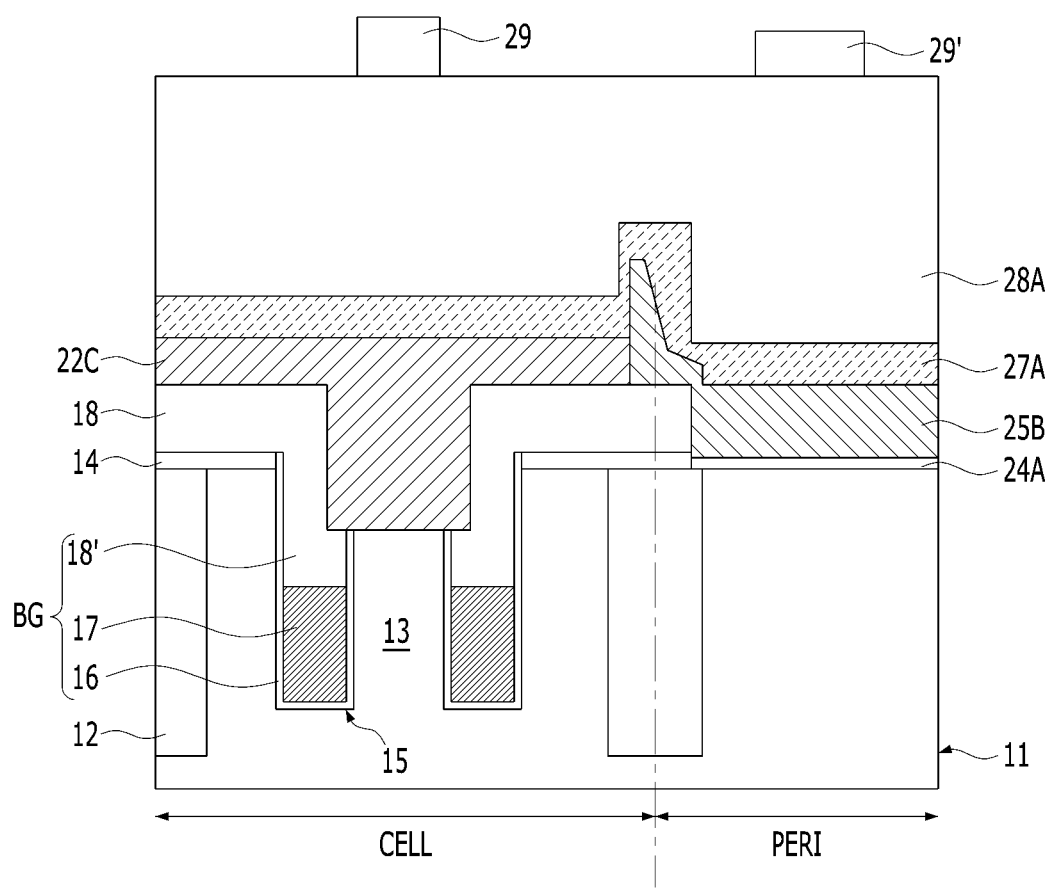
Figure 2P:
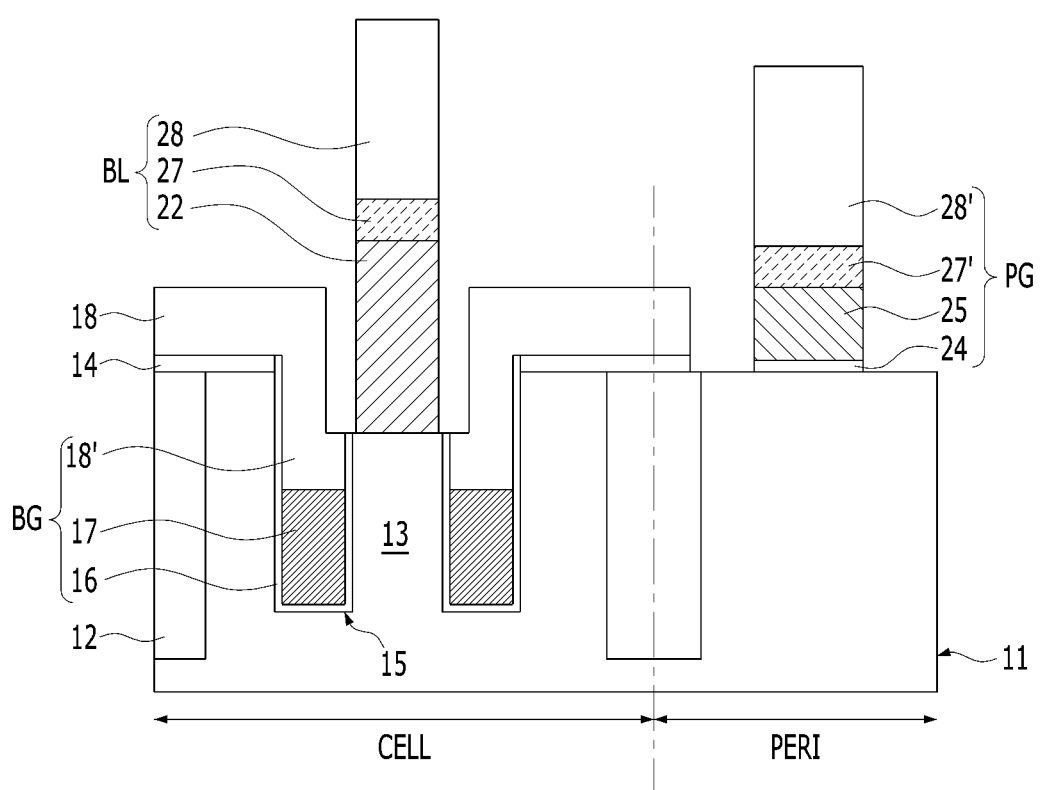
Figure 3A:
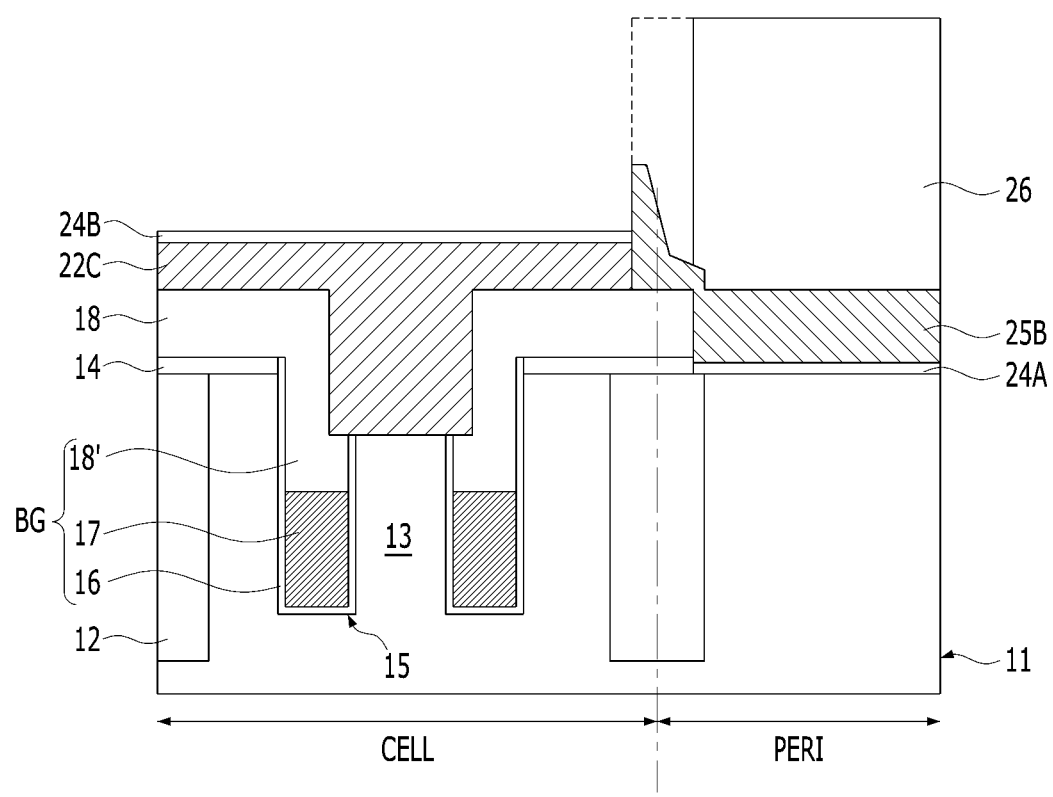
FIGS. 3A and 3B are cross-sectional views illustrating a method for fabricating a semiconductor device according to another embodiment of the present invention.
Figure 3B:
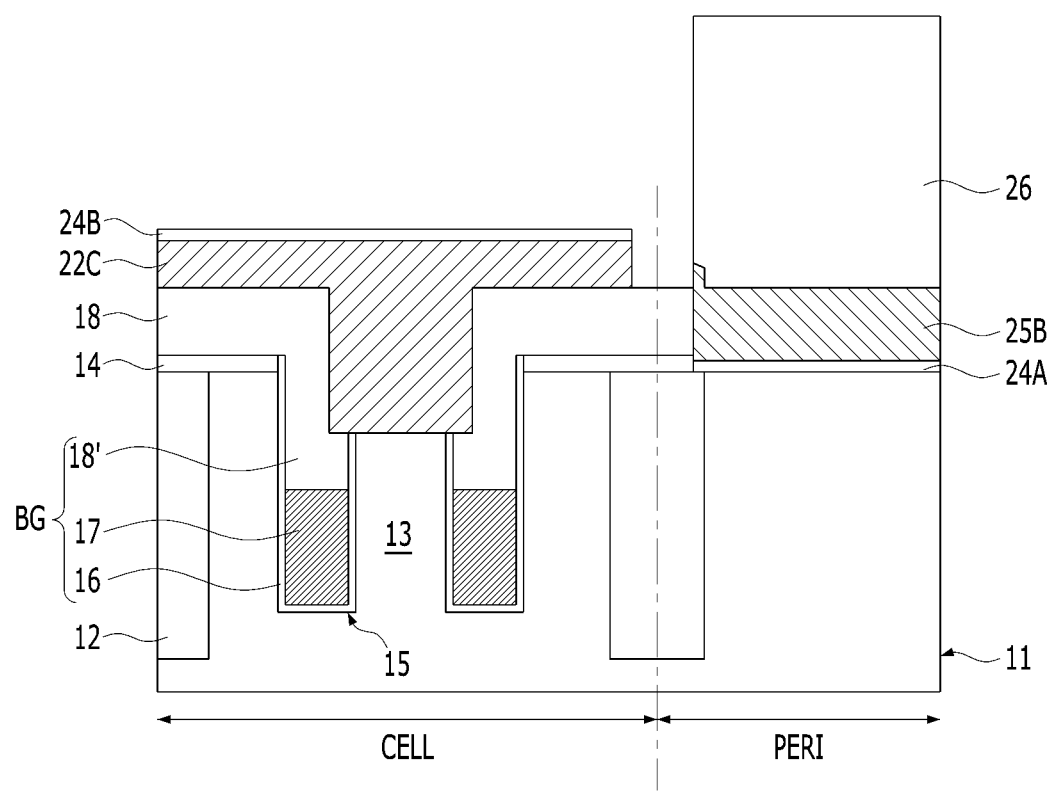

As shown in FIGS. 2O and 2P, a bitline conductive layer 27A and a pattern hardmask layer 28A may be sequentially formed over the entire surface of the substrate 11 including the plug conductive layer 22C and the peri-gate conductive layer 24B.

The bitline conductive layer 27A may function as a bitline of the cell region CELL and a gate electrode of the peripheral region PERI. The bitline conductive layer 27A may include a metal-containing material. The bitline conductive layer 27A may include, for example, a metal, a metal nitride, a metal silicide, or a combination thereof. In one embodiment, the bitline conductive layer 27A may include tungsten (W). In another embodiment, the bitline conductive layer 27A may include a stack of titanium nitride and tungsten (TiN/W). When the bitline conductive layer 27A includes a stack of titanium nitride and tungsten (TiN/W), the titanium nitride may serve as a barrier.

The pattern hardmask layer 28A may function as a bitline hardmask of the cell region CELL and a gate hardmask of the peripheral region PERI. The pattern hardmask layer 28A may include a material having an etch selectivity with respect to the bitline conductive layer 27A, the plug conductive layer 22C, and the peri-gate conductive layer 25B. The pattern hardmask layer 28A may include an insulating material. The pattern hardmask layer 28A may include silicon oxide or silicon nitride. In one embodiment, the pattern hardmask layer 28A may be formed of silicon nitride.

Subsequently, first and second pattern masks 29 and 29' may be formed on the pattern hardmask layer 28A. The first pattern mask 29 may define a bitline of the cell region CELL. The second pattern mask 29' may define a gate pattern of the peripheral region PERI. The first and second pattern masks 29 and 29' may be formed at the same time or may be formed by separate processes, respectively.

Subsequently, as shown in FIG. 2P, a bitline structure BL in which a bitline contact plug 22, a bitline 27, and a bitline hardmask 28 are stacked may be formed in the cell region CELL. In the peripheral region PERI, a peri-gate structure PG in which a peri-gate insulating layer 24, a first peri-gate electrode 25, a second peri-gate electrode 27', and a peri-gate hardmask 28' are stacked may be formed.

The bitline structure BL and the peri-gate structure PG may be formed by an etching process using the first and second pattern masks 29 and 29'. The bitline structure BL may be formed by sequentially etching the pattern hardmask layer 28A, the bitline conductive layer 27A, and the plug conductive layer 22C of the cell region CELL using the first pattern mask 29. The peri-gate structure PG may be formed by sequentially etching the pattern hardmask layer 28A, the bitline conductive layer 27A, the peri-gate conductive layer 25B, and the barrier layer 24B of the peripheral region PERI using the second pattern mask 29'.

The bitline structure BL and the gate structure PG may be formed at the same time. The pattern hardmask layer 28A, the bitline conductive layer 27A, and the peri-gate conductive layer 25B not covered by the first and second pattern masks 29 and 29' may all be removed. Although not shown, a partial thickness of the peri-gate conductive layer 25B, which is formed thickly at the boundary region between the cell region CELL and the peripheral region PERI and covered by the cell open mask of FIG. 2M may remain after forming the bitline structure BL and the gate structure PG.

Although not shown, as a subsequent process, a memory element in the cell region and metal wiring in the cell region and in the peripheral region may be formed. The word line WL, the bitline structure BL, and the memory element in the cell region and the gate structure PG in the peripheral region may be electrically connected to the metal wiring through a metal wiring contact.

As described above, a thickness of a polysilicon layer remaining in the region where the cell open mask 26 and the peri-open mask 23 overlap with each other, that is a boundary region where the cell region CELL and the peripheral region PERI contact each other, may be reduced by removing the plug conductive layer 22C disposed at the boundary region where the cell region CELL and the peripheral region PERI are in contact by using the trimmed peri-open mask 23T. Therefore, it is possible to prevent a contact failure of a subsequent metal wiring by minimizing a thickness of the polysilicon layer remaining in the boundary region where the cell region CELL and the peripheral region PERI are in contact or by preventing residues of the polysilicon layer after a patterning process for forming the bitline structure BL and the peri-gate structure PG.

The above-described invention is not limited by the above-described embodiments and the accompanying drawings. It will readily be appreciated by one of ordinary skill in the art that various substitutions, changes, or modifications may be made thereto without departing from the scope of the disclosure.

What is claimed is:

1. A method for fabricating a semiconductor device, the method comprising:
   forming an insulating layer over a substrate, the substrate including a cell region and a peripheral region;
   forming an opening by selectively etching the insulating layer over the substrate of the cell region;
   forming a plug conductive layer to fill the opening and cover the insulating layer;
   etching the plug conductive layer and the insulating layer over the substrate of the peripheral region by using a peri-open mask covering the cell region;
   trimming the peri-open mask to expose the plug conductive layer over the substrate of a boundary region where the cell region and the peripheral region contact each other;
   etching the plug conductive layer over the substrate of the boundary region by using the trimmed peri-open mask;
   forming a peri-gate conductive layer over an entire surface of the substrate; and
   etching the peri-gate conductive layer by using a cell open mask.

2. The method of claim 1, before the forming of the peri-gate conductive layer, further including forming a barrier layer over the entire surface of the substrate.

3. The method of claim 2, wherein the barrier layer has an etch selectivity with respect to the peri-gate conductive layer and the plug conductive layer.

4. The method of claim 2, wherein the barrier layer includes silicon oxide.

5. The method of claim 1, wherein the peri-open mask includes a photoresist.

6. The method of claim 1, wherein the etching of the peri-gate conductive layer using the cell open mask includes:
   forming the cell open mask on the peri-gate conductive layer over the substrate of the peripheral region; and
   etching the peri-gate conductive layer disposed over the substrate of the boundary region where the cell region and the peripheral region contact each other by using the trimmed cell open mask.

7. The method of claim 1, wherein the cell open mask includes a photoresist.

8. The method of claim 1, wherein the plug conductive layer includes a material having an etch selectivity with respect to the insulating layer.

9. The method of claim 1, wherein the insulating layer includes silicon nitride.

10. The method of claim 1, wherein the plug conductive layer includes polysilicon.

11. The method of claim 1, wherein the peri-gate conductive layer includes a material having an etch selectivity with respect to the insulating layer.

12. The method of claim 1, wherein the peri-gate conductive layer includes polysilicon.

13. The method of claim 1, wherein the substrate of the cell region includes a buried gate structure.

14. The method of claim 13, wherein the opening is disposed between neighboring buried gate structures.

15. The method of claim 13, wherein a bottom surface of the opening is at a higher level than an upper surface of a gate electrode of the buried gate structure.

16. The method of claim 1, further comprising:
after etching the peri-gate conductive layer by using the cell open mask,
sequentially forming a bitline conductive layer and a bitline hardmask layer over the entire surface of the substrate; and
forming a bitline structure over the substrate of the cell region and a peri-gate structure over the substrate of the peripheral region by using a pattern mask.

17. The method of claim 16, wherein the pattern mask includes a first pattern mask and a second pattern mask having different line widths.

\* \* \* \* \*